US008612797B2

(12) United States Patent
Thayer et al.

(10) Patent No.: US 8,612,797 B2
(45) Date of Patent: Dec. 17, 2013

(54) SYSTEMS AND METHODS OF SELECTIVELY MANAGING ERRORS IN MEMORY MODULES

(75) Inventors: Larry J. Thayer, Fort Collins, CO (US);
Andrew C. Walton, Roseville, CA (US);
Mike H. Cogdill, Fort Collins, CO (US);
George Krejci, Richardson, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2113 days.

(21) Appl. No.: 11/394,585

(22) Filed: Mar. 31, 2006

(65) Prior Publication Data

US 2007/0234112 A1  Oct. 4, 2007

(51) Int. Cl.
*G06F 11/07* (2006.01)

(52) U.S. Cl.
USPC .......... 714/6.13; 714/6.1; 714/6.11; 714/710; 714/764; 714/768

(58) Field of Classification Search
USPC .............. 714/3, 4, 5, 8, 710, 768, 7, 764, 6.1, 714/6.13
See application file for complete search history.

(56) References Cited

U.S. PATENT DOCUMENTS

| | | | |
|---|---|---|---|
| 5,537,631 A * | 7/1996 | Wong et al. | 714/7 |
| 6,256,756 B1 * | 7/2001 | Faulk, Jr. | 714/718 |
| 6,467,048 B1 * | 10/2002 | Olarig et al. | 714/7 |
| 6,820,224 B1 * | 11/2004 | Lin et al. | 714/710 |
| 6,941,423 B2 | 9/2005 | Coulson | |
| 2001/0044880 A1 * | 11/2001 | Franaszek et al. | 711/117 |
| 2002/0091965 A1 | 7/2002 | Moshayedi | |
| 2003/0005353 A1 * | 1/2003 | Mullins et al. | 714/5 |
| 2003/0041295 A1 * | 2/2003 | Hou et al. | 714/710 |
| 2003/0065891 A1 * | 4/2003 | Sato | 711/141 |
| 2004/0057502 A1 * | 3/2004 | Azenkot et al. | 375/147 |
| 2004/0088490 A1 | 5/2004 | Ghosh | |
| 2004/0088636 A1 * | 5/2004 | Cypher | 714/764 |
| 2004/0210803 A1 * | 10/2004 | Cheng et al. | 714/710 |
| 2004/0225943 A1 | 11/2004 | Brueggen | |
| 2004/0225944 A1 | 11/2004 | Brueggen | |
| 2005/0081125 A1 * | 4/2005 | Cochran et al. | 714/56 |
| 2005/0289402 A1 * | 12/2005 | Nerl et al. | 714/52 |
| 2005/0289439 A1 | 12/2005 | Nerl et al. | |
| 2005/0289440 A1 | 12/2005 | Nerl et al. | |
| 2006/0010335 A1 * | 1/2006 | Venkatraman et al. | 714/3 |

(Continued)

FOREIGN PATENT DOCUMENTS

WO    WO 2005024843    3/2005

OTHER PUBLICATIONS

Kaneda, Shigeo, et al., "Single Byte Error Correcting-Double Byte Error Detecting Codes for Memory Systems", IEEE Transactions on Computers, vol. C-31, No. 7, Jul. 1982.

(Continued)

*Primary Examiner* — Chae Ko

(57) ABSTRACT

System and methods of selectively managing errors in memory modules. In an exemplary implementation, a method may include monitoring for persistent errors in the memory modules. The methods may also include mapping at least a portion of the memory modules to a spare memory cache only to obviate persistent errors. The method may also include initiating memory erasure on at least a portion of the memory modules only if insufficient cache lines are available in the spare memory cache.

20 Claims, 4 Drawing Sheets

(56) References Cited

U.S. PATENT DOCUMENTS

| | | |
|---|---|---|
| 2006/0059383 A1* | 3/2006 | Roohparvar .................... 714/5 |
| 2006/0062046 A1 | 3/2006 | Babudri et al. |
| 2006/0087943 A1 | 4/2006 | Kuraoka et al. |
| 2007/0005897 A1* | 1/2007 | Bink et al. .................... 711/128 |
| 2007/0094551 A1 | 4/2007 | Lambert et al. |

OTHER PUBLICATIONS

Morelos-Zaragoza, Robert H., "The Art of Error Correcting Coding", Sony Computer Science Laboratories, Inc., Japan.

U.S. Appl. No. 11/261,270, filed on Oct. 27, 2005, for "Memory Controller".

U.S. Appl. No. 11/257958, filed on Oct. 24, 2005, for "Determining Hard Errors vs. Soft Errors in Memory".

* cited by examiner

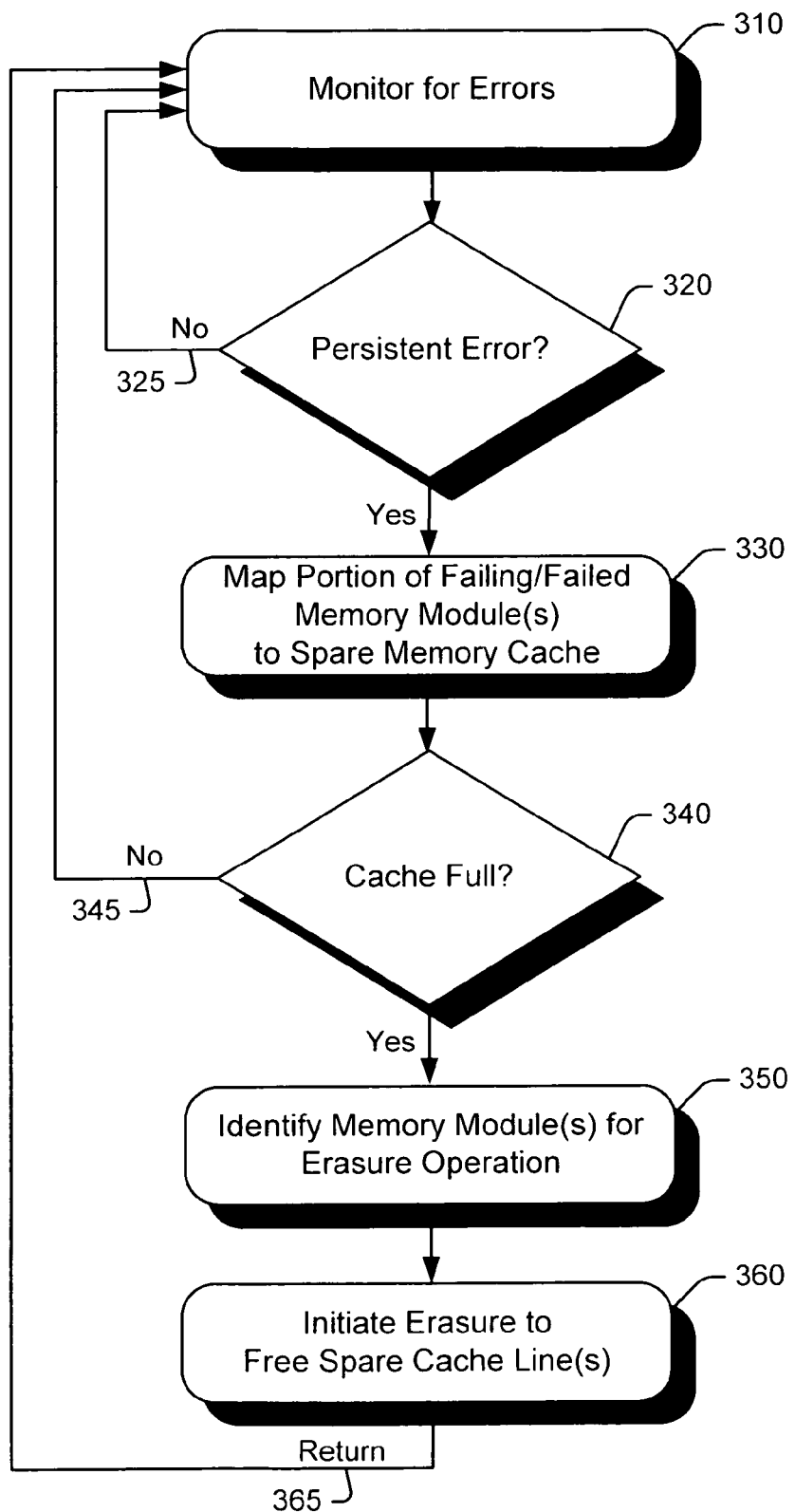

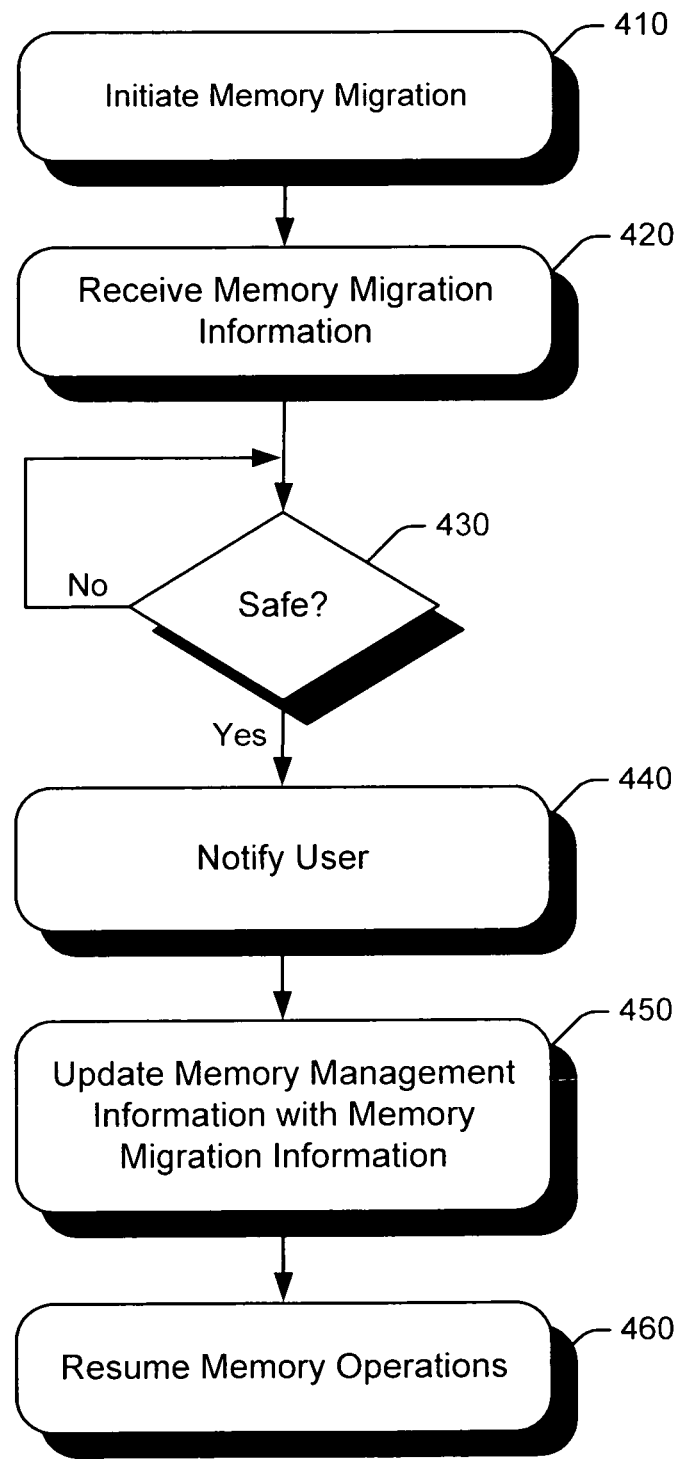

SYSTEMS AND METHODS OF SELECTIVELY MANAGING ERRORS IN MEMORY MODULES

BACKGROUND

Computer memory systems typically include one or more memory modules, such as, e.g., dynamic random access memory (DRAM), which may be readily accessed by a processor. During normal operation of the computer system, a memory controller transfers data between a data store (e.g., hard disk drive) and the memory modules, and between the memory modules and the processor. From time-to-time, all or a part of the memory modules may fail.

Memory failures may cause data to be corrupted or even lost. Some operating systems are configured to de-allocate entire "pages" of the memory modules that are associated with the failure. De-allocating memory in this manner unnecessarily reduces the amount of memory available to the processor(s), and may even cause the computer system to cease operations. More sophisticated computer systems implement erasure, wherein a specific bit or bits in the memory module which are determined to be causing the error are ignored. In other systems, a spare memory cache may implemented to replace failing or failed portions of memory modules by mapping failing portions of the memory modules to the spare memory cache. As more errors are encountered, however, the spare memory cache may be used up.

BRIEF DESCRIPTION OF THE DRAWINGS

FIG. 3 is a flowchart illustrating exemplary operations which may be implemented for selectively managing errors in memory modules.

FIG. 4 is another flowchart illustrating exemplary operations which may be implemented for memory migration when selectively managing errors in memory modules.

DETAILED DESCRIPTION

Figure 1:
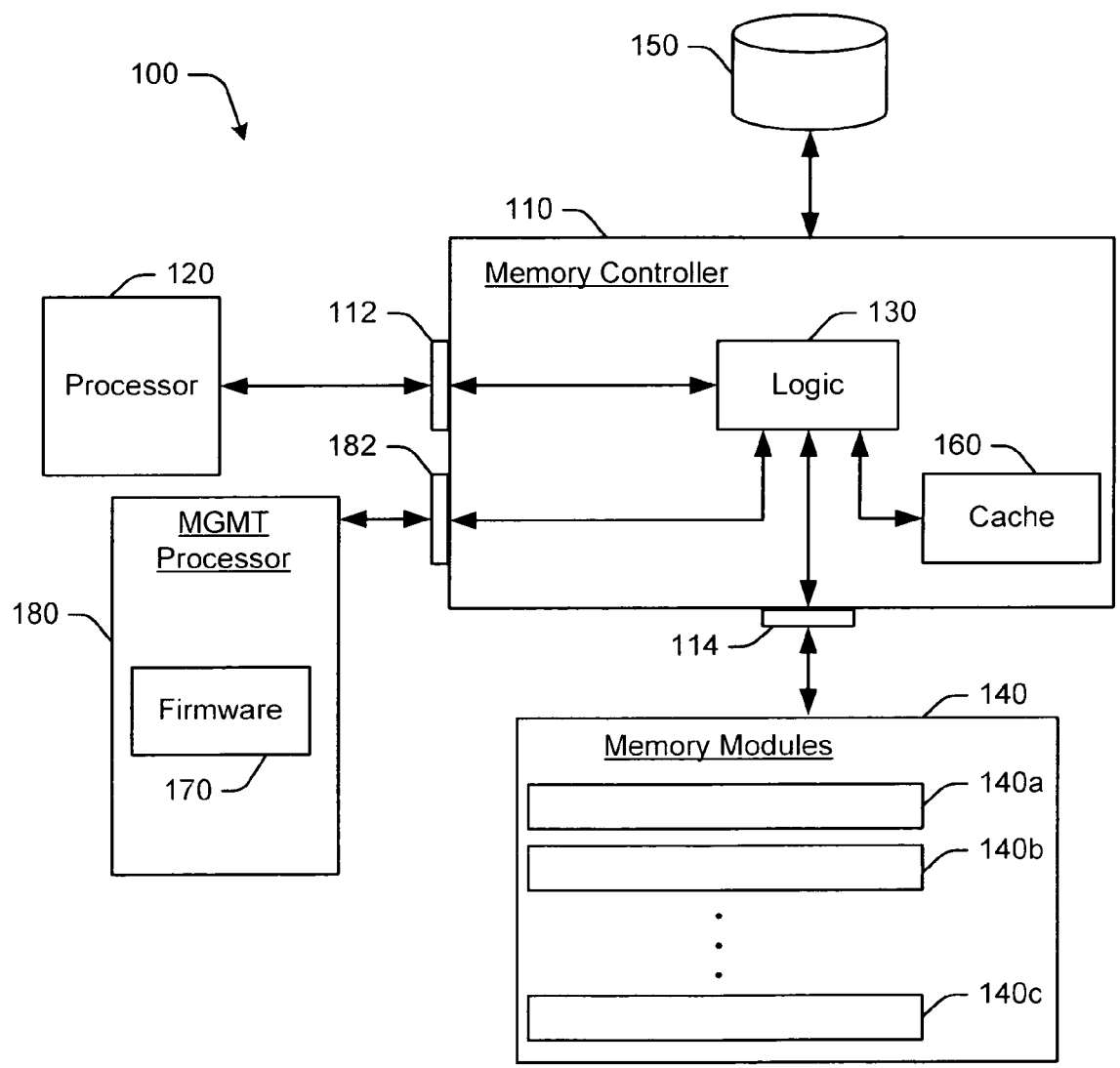
FIG. 1 is a high-level block diagram of an exemplary computer system which may be implemented for selectively managing errors in memory modules.

FIG. 1 is a high-level block diagram of an exemplary computer system 100 which may be implemented for selectively managing errors in memory modules. Exemplary computer system 100 may include a memory controller 110 communicatively coupling a processor 120 to one or more memory modules 140a-c (generally referred to as memory modules 140), e.g., via a memory bus and interfaces 112, 114, respectively. Memory controller 110 handles read/write requests for a processor 120 by accessing the memory modules 140 (e.g., via logic 130).

Memory modules 140 may be implemented as addressable memory locations in which data retrieved from a data store 150 (e.g., disk drive) may be temporarily stored for faster access by the processor 120. In an exemplary embodiment, memory modules 140 are implemented as dynamic random access memory (DRAM), and may include any number of memory modules (e.g., the memory modules 140a-c shown in FIG. 1).

In operation, a portion of one or more of the memory modules 140 may fail. For example, data associated with specific bits in the memory modules 140 may be corrupted due to persistent or intermittent hardware failure, such as, a malfunctioning DRAM component, a wire defect, etc. Transient or "soft" errors, occur intermittently, and are usually not indicative of a serious hardware failure. These errors can typically be handled by retrying the read/write request or rewriting corrected data. Persistent or "hard" errors occurring repeatedly may indicate that one or more bits in the memory modules 140a, 140b is failing or has failed.

Computer system 100 may respond to persistent errors by mapping the failing or failed bits of the memory modules 140 to a spare memory cache 160, applying memory erasure to one or more of the memory modules 140 to free cache lines in the spare memory cache 160, and optionally, implementing page de-allocation for one or more of the memory modules 140, and/or handling memory migration so that one or more memory module can be added, removed and/or replaced (referred to herein as "added/removed/replaced").

One or more of these operations may be implemented selectively by program code 170. That is, the program code 170 may determine which of the operations to implement and when to implement the operation(s). For example, program code 170 may only map portions of the memory modules which are exhibiting persistent errors to the spare memory cache. In addition, the program code 170 may only apply memory erasure to memory modules contributing the largest number of errors and only after the spare memory cache 160 is exhausted.

It is noted that these examples for selectively managing memory operations are not intended to be limiting. In other exemplary embodiments, memory erasure may be selectively applied to all of the memory modules which contributed errors. In another example, erasure may be selectively applied only to slower and/or older memory modules. Still other embodiments are also contemplated.

In an exemplary embodiment, program code 170 may be implemented as firmware executable by a management processor 180 coupled to the memory controller 110, e.g., via interface 182. It will be readily appreciated by those skilled in the art after becoming familiar with the teachings herein that program code 170 is not limited to such implementation. In other embodiments, the program code 170 may be executable by the memory controller 110, processor 120, and/or other components of the computer system 100. Exemplary functional components of the program code 170 are described in more detail below with reference to FIG. 2.

Figure 2:
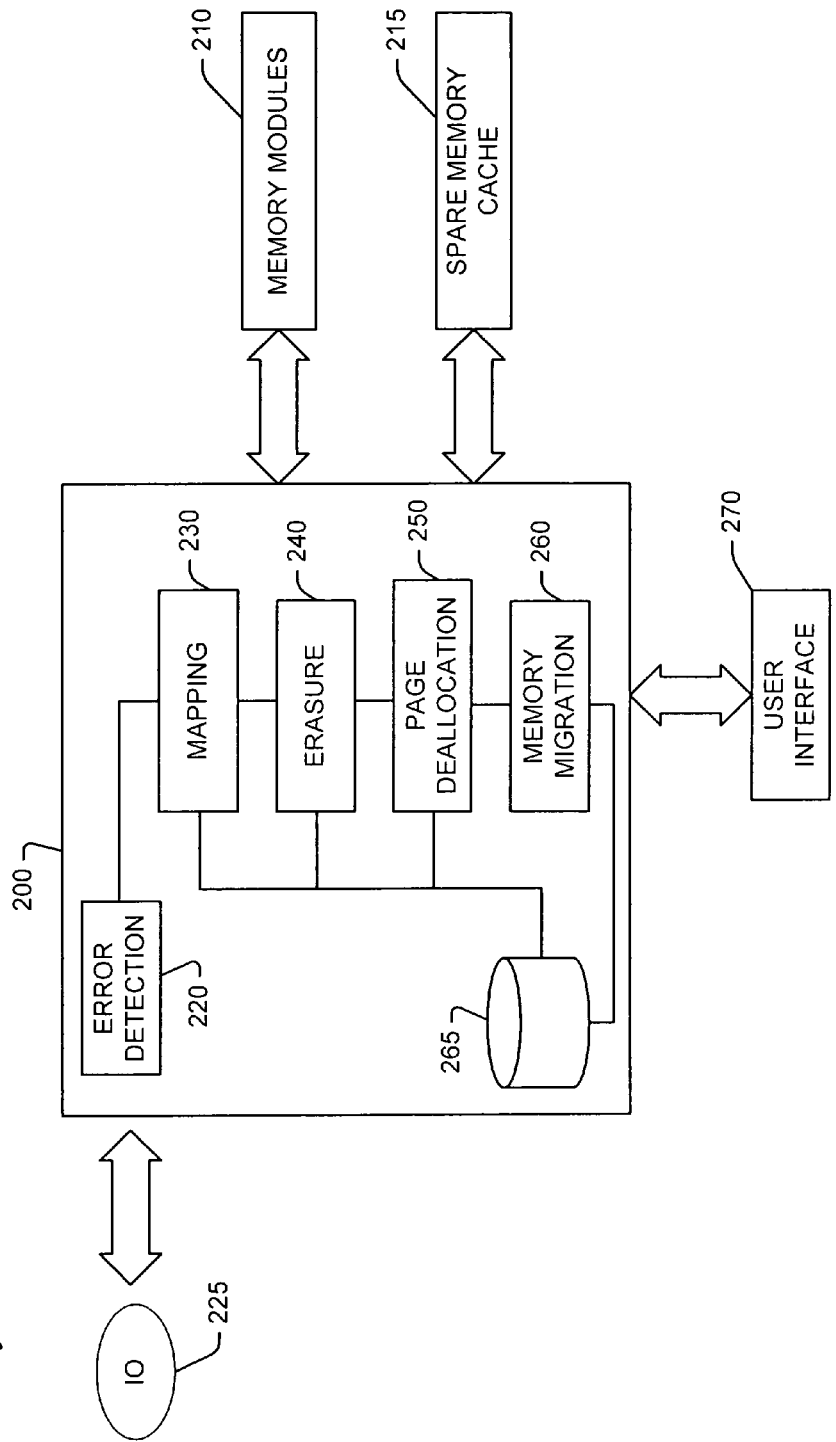
FIG. 2 is a functional block diagram of exemplary program code for selectively managing errors in memory modules.

FIG. 2 is a functional block diagram of exemplary firmware 200 for selectively managing errors in memory modules 210 (e.g., the program code 170 and memory modules 140 shown in FIG. 1). Before continuing, it is noted that the large arrows illustrated in FIG. 2 between the firmware 200 and memory modules 210, the firmware 200 and spare memory cache 215, and the firmware 200 and user interface 270 represent communication between these components and do not necessarily represent direct connections.

Exemplary firmware 200 may include error detection module 220 for monitoring errors in the memory controller (e.g., the memory IO 225), mapping module 230 for mapping failing or failed portions of the memory modules 210 to spare memory cache 215, memory erasure module 240 for "erasing" portions of memory modules 210, page de-allocation module 250 for de-allocating entire memory modules 210, and memory migration module 260 to facilitate replacement of memory modules 210. Before continuing, it is noted that "erasing" portions of memory modules does not "zero out" the contents, but is rather a process wherein the data is "ignored" from a portion of the memory subsystem that is known to be bad. The ignored data is replaced through use of an Error Correction Code (ECC).

Error detection module 220 may be implemented to monitor error correction activity corresponding to read/write requests, e.g., the use of error correction code (ECC) algorithms by the memory controller. For example, error detection module 220 may monitor how many times data needs to be error-corrected. The error detection module 220 may also determine whether portions of the memory modules are exhibiting transient or persistent errors.

In an exemplary embodiment, error detection module 220 implements an algorithm which analyzes the occurrences of data corruption to identify repeated bit patterns. If a repeated bit pattern is identified, the software algorithm correlates the occurrence of data corruption to a particular memory component. If a sufficient number of occurrences of data corruption are detected as originating from the particular component according to the same pattern of data corruption, the algorithm activates the mapping module 230 to remedy the underlying hardware issue through application of the spare memory cache.

Mapping module 230 maps the failed portion of the memory modules 210 to one or more memory locations in the spare memory cache 215, e.g., in memory management table 265. For example, the management processor may write to registers in the memory controller to route read/write requests for the memory modules 210 to the spare memory cache using an out-of-band path. The term "out-of-band" as used herein refers to alternate modes of operation (e.g., not the standard or typical path for memory operations).

Mapping module 230 may also copy the contents of the failing or failed portion of the memory modules 210 into the spare memory cache 215. The memory controller (e.g., via logic 130 shown in FIG. 1) may then access the memory management table 265 to direct read/write requests for the failing or failed memory locations in memory modules 210 to the spare memory cache 215 when an address associated with the read/write request is mapped to the spare memory cache 215.

Before continuing, it is noted that the spare memory cache 215 may be implemented, e.g., as a fully associative cache, a FIFO, or a stack, wherein a physical memory address is stored along with the contents of a portion of memory that corresponds to the address. Given the cost of implementing a larger spare memory cache 215, the number of cache lines in the spare memory cache 215 may be limited to a relatively small number, such as eight.

Over time as the spare memory cache 215 is used to obviate errors, all of the cache lines may be used Lip. Accordingly, memory erasure module 240 may be invoked to free cache lines in the spare memory cache 215 by "erasing" portions of the memory modules 210 that exhibited persistent errors. Erased memory locations in the memory modules 210 may be maintained in the memory management table 265.

As used herein, the term "erasing" refers to decoding an ECC code word by assuming that an identified bit or bits are corrupted. The erasure mode is activated by loading a register in a memory controller with a suitable value to identify the location of the repeatable error. The algorithm may activate the erasure mode by setting appropriate registers of the memory controller. The memory controller responds by decoding ECC code words by assuming that the identified bits within the ECC code words are corrupted, and therefore "ignoring" the contribution from these bits and recreating the values the bits should contain to correct the error.

In an exemplary embodiment, ECC logic in the memory controller may implement the decoding procedure of a [36, 33, 4] shortened narrow-sense Reed-Solomon code (where the code word length is 36 symbols, the payload length is 33 symbols, and the Hamming distance is 4 bits) over the finite Galios field ($2^8$). The finite Galios field defines the symbol length to be 8 bits. By adapting the ECC logic in this manner, the error correction may occur in two distinct modes. In a first mode, ECC logic in the memory controller performs single-byte correction. In the second mode (the erasure mode), a byte location (or locations) is specified in the ECC code word as an erasure via a register setting. The location is identified by a software or firmware process as a repeatable error caused by a hardware failure. The ECC logic decodes the retrieved data by assuming that the single-byte associated with the identified erasure is corrupted. Because the minimum Hamming distance is reduced, the ECC logic enables the data to be recovered even when another (e.g., a transient) single-byte error is present in addition to the erasure error.

It is noted that the foregoing example is provided for purposes of illustration and is not intended to be limiting. Other embodiments for implementing memory erasure, either now known or later developed, are also contemplated.

Over still more time as erasure is used to return (or make available again) cache lines in the spare memory cache 215, it may be desirable to de-allocate one or more pages of the memory modules 210. For example, it may be desirable to invoke page de-allocation if the memory modules 210 include so many errors that erasure slows or otherwise impedes memory operations. Page de-allocation module 250 may be implemented to remove pages of the memory modules 210 from access by the processor. De-allocated pages may be maintained in memory management table 265.

By having first selectively used the spare memory cache 215 to obviate errors, and then selectively applied memory erasure to free cache lines for use again in obviating errors, the use of page de-allocation is minimized and the memory modules 210 are not de-allocated unnecessarily or prematurely.

It may also become necessary or desirable to add/remove/replace one or more of the memory modules 210. For example, memory modules 210 may be added/removed/replaced if so many of the memory modules have been de-allocated from use that the computer system is slowing or no longer operating efficiently. Memory modules may also be added/removed/replaced to upgrade the memory system.

Memory migration module 260 may be operatively associated with the memory management table 265 to facilitate adding/removed/replacing memory modules 210. Memory migration module 260 may also be operatively associated with a user interface 270 to receive input from a user (e.g., which memory modules are being added/removed/replaced). In an exemplary embodiment, the user interface 270 is implemented in software as a graphical user interface (GUI) available to a user via the operating system. Before a user adds/removes/replaces memory modules 210 the user notifies the memory migration module 260 via the user interface which memory modules 210 are to be added/removed/replaced. The memory migration module 260 prepares the memory management table 265 for the memory migration, and then responds by notifying the user when it is safe to add/remove/replace the memory modules 210.

As discussed above, the firmware 200 dynamically updates (i.e., continually during operation) the memory management table 265. Accordingly, memory management table 265 stays current, identifying those portions of the memory modules 210 which are being mapped to spare memory cache 215, those portions of the memory modules 210 which are "erased", and those portions of the memory modules 210 which are de-allocated.

By implementing the memory migration module 260 and memory management table 265 in firmware 200 directly associated with the memory controller 110 (separately from the operating system or other system software), memory management does not need to be relearned. That is, the portions of memory modules that are still in use after memory migration, continue to be mapped to the spare memory cache 215, erased, and de-allocated even after adding/removing/replacing one or more of the memory modules 210. Such an embodiment is particularly desirably where the computer system is executing multiple operating systems and/or where the operating system(s) does not support memory management such as, page de-allocation.

Before continuing, it is noted that the functional components of program code 200 shown in FIG. 2 and described above are provided for purposes of illustration only, and are not intended to be limiting. The functional components shown in FIG. 2 do not need to be encapsulated as separate modules. In addition, other functional components (not shown) may also be provided and are not limited to those shown and described herein.

FIGS. 3 and 4 are flowcharts illustrating exemplary operations. The operations may be embodied as logic instructions on one or more computer-readable medium. When executed on a processor, the logic instructions cause a general purpose computing device to be programmed as a special-purpose machine that implements the described operations. In an exemplary embodiment, the components and connections depicted in the figures may implement the operations.

FIG. 3 is a flowchart illustrating exemplary operations 300 which may be implemented for selectively managing errors in memory modules. Error monitoring begins in operation 310. For example, the memory controller (or IO within the memory controller) may be monitored for errors. A determination is made in operation 320. If an error is determined to be a transitory (or "soft") error, operations return as illustrated by arrow 325 to operation 310 to continue monitoring for errors. If an error is determined to be a persistent (or "hard") error, the portion(s) of memory module(s) exhibiting a persistent error is mapped to a spare memory cache in operation 330.

In operation 340 a determination is made whether the spare memory cache is "full." For example, if all of the cache lines in the spare memory cache are already being implemented, the spare memory cache may be full. Alternatively, the spare memory cache may be considered full if there are insufficient cache lines available for mapping predicted failures of the memory modules, or if the remaining cache lines will be mapped before other memory management operations can be implemented (e.g., erasure in operation 360).

If the spare memory cache is not full, operations may return as indicated by arrow 345 to continue monitoring for errors. If the spare memory cache is determined to be full, one or more of the memory modules is identified in operation 350 for applying memory erasure. In an exemplary embodiment, the memory module(s) exhibiting the most persistent errors is selected for erasure. Other examples for selecting memory modules for erasure are also contemplated, and include for example, selecting older (or newer), slower (or faster) memory modules.

In operation 360, the memory module(s) identified in operation 350 are erased to free cache lines in the spare memory cache. Operations may then return to operation 310 to continue monitoring for errors, as illustrated by arrow 365.

It is noted that the operations are not limited to the ordering shown in FIG. 3. For example, operations may continue to monitor for errors (operation 310) while mapping and/or erasure operations are being executed. Still other operations may also be implemented, such as, e.g., page de-allocation and/or memory migration operations.

FIG. 4 is another flowchart illustrating exemplary operations 400 which may be implemented for memory migration when selectively managing errors in memory modules. In operation 410, memory migration is initiated. For example, a user may initiate memory migration via a user interface before adding/removing/replacing memory modules. In operation 420, memory migration information is received, e.g., from the user identifying which memory modules are being added/removed/replaced. Other memory migration information may include physical characteristics of the memory modules (e.g., memory size, speed, etc.). Still other information may be provided during operation 420.

In operation 430, a determination is made whether it is safe to proceed with memory migration. If it is not safe, operations loop until it becomes safe to proceed. For example, it may not be safe to proceed if the firmware is in the process of updating the memory management table because adding/removing/replacing memory during this process may corrupt the memory management table. If it is safe to proceed with memory migration, a user may be notified in operation 440 and the memory modules can be physically added/removed/replaced.

In operation 450, memory management information (e.g., contained in the memory management table) may be updated with memory migration information. For example, memory management information may be updated to remove mapping to the spare memory cache, remove erasures, and/or remove de-allocated pages corresponding to a memory module which has been removed or replaced by the memory migration. Memory operations may resume in operation 460.

It is noted that the operations are not limited to the ordering shown in FIG. 4. For example, memory migration information may be received (operation 420) after notifying the user that it is safe to migrate the memory (operation 440). Still other operations may also be implemented, such as, e.g., opting out of the loop for operation 430.

It is noted that the exemplary embodiments shown and described are provided for purposes of illustration and are not intended to be limiting. Still other embodiments are also contemplated for selectively managing errors in memory modules.

The invention claimed is:

1. A method for selectively managing errors in memory modules, comprising:
    monitoring for persistent errors in the memory modules;
    mapping at least a portion of the memory modules to a spare memory cache only to obviate persistent errors; and
    selectively invoking program code to erase a portion of the memory modules if the spare memory cache is exhausted.

2. The method of claim 1, further comprising initiating page de-allocation for at least one of the memory modules only after using the spare memory cache and initiating memory erasure.

3. The method of claim 1, further comprising identifying at least one of the following in a memory management table:
    portions of the memory modules memory mapped to the spare memory cache;
    erased portions of the memory modules; and
    de-allocated pages in the memory modules.

4. The method of claim 3, further comprising updating the memory management table to support memory migration.

5. The method of claim 1, further comprising identifying the portions of the memory modules for memory erasure based on hardware characteristics of the memory modules.

6. The method of claim 1, further comprising identifying the portions of the memory modules for memory erasure based on an error rate of the memory modules.

7. The method of claim 1, further comprising determining there are insufficient cache lines available in the spare memory cache if all of the cache lines are mapping memory modules with persistent errors.

8. The method of claim 1, further comprising determining there are insufficient cache lines available in the spare memory cache if additional cache lines are predicted to be needed before memory erasure frees the additional cache lines.

9. The method of claim 1, further comprising continuing mapping portions of the memory modules to the spare memory cache and continuing memory erasure after migrating at least one of the memory modules without having to rediscover the persistent errors.

10. A memory system comprising:
a memory controller for a plurality of memory modules;
a management processor operatively associated with the memory controller and a spare memory cache, the management processor executing:
program code for identifying errors in the memory modules;
program code selectively invoked to obviate persistent errors in the memory modules by routing at least some read/write requests to the spare memory cache; and
program code selectively invoked to erase a portion of the memory modules if the spare memory cache is exhausted.

11. The memory system of claim 10, further comprising program code selectively invoked to de-allocate one or more pages of the memory modules if at least some of the memory modules are erased.

12. The memory system of claim 10, further comprising a memory management table identifying memory management functions for the memory modules.

13. The memory system of claim 12, wherein the memory management table identifies erased portions of the memory modules.

14. The memory system of claim 13, wherein the memory management table identifies de-allocated pages in the memory modules.

15. The memory system of claim 12, further comprising program code for dynamically updating the memory management table.

16. The memory system of claim 12, further comprising program code for updating the memory management table for memory migration.

17. The memory system of claim 10, wherein the management processor writes to registers in the memory controller to reroute read/write requests for the memory modules to the spare memory cache using an out-of-band path.

18. The memory system of claim 10, further comprising program code for interfacing with a user during memory migration, the program code receiving memory migration information from the user and notifying the user if it is safe to proceed with the memory migration.

19. A system for selectively managing errors in memory modules, comprising:
means for identifying persistent errors in the memory modules;
means for rerouting IO addressed to at least a portion of the memory modules instead to a spare memory cache only in response to persistent errors; and
means for erasing at least a portion of the memory modules only in response to all cache lines in the spare memory cache being used for the rerouted IO.

20. The system of claim 19, further comprising means for identifying memory management changes for continued memory operations after memory migration.

* * * * *